US011237729B1

(12) United States Patent
Dwibedy et al.

(10) Patent No.: US 11,237,729 B1
(45) Date of Patent: Feb. 1, 2022

(54) FAST BUS INVERSION FOR NON-VOLATILE MEMORY

(71) Applicant: SANDISK TECHNOLOGIES LLC, Addison, TX (US)

(72) Inventors: Debasish Dwibedy, Karnataka (IN); A Harihara Sravan, Karnataka (IN); Nihal Singla, Karnataka (IN); Muralikrishna Balaga, Karnataka (IN)

(73) Assignee: SANDISK TECHNOLOGIES LLC, Addison, TX (US)

( * ) Notice: Subject to any disclaimer, the term of this patent is extended or adjusted under 35 U.S.C. 154(b) by 0 days.

(21) Appl. No.: 17/068,955

(22) Filed: Oct. 13, 2020

(51) Int. Cl.
*G06F 3/06* (2006.01)

(52) U.S. Cl.
CPC ............ *G06F 3/061* (2013.01); *G06F 3/0655* (2013.01); *G06F 3/0679* (2013.01)

(58) Field of Classification Search
CPC ......... G06F 3/061; G06F 3/0679; G06F 3/655
USPC .......................................................... 711/154
See application file for complete search history.

(56) References Cited

U.S. PATENT DOCUMENTS

| | | | | |
|---|---|---|---|---|
| 5,931,959 | A * | 8/1999 | Kwiat | G06F 11/1489 714/48 |
| 7,522,073 | B1 | 4/2009 | Kao | |
| 8,706,958 | B2 | 4/2014 | Hein | |
| 8,726,139 | B2 | 5/2014 | O'Connor et al. | |
| 9,244,875 | B1 | 1/2016 | Loke et al. | |
| 9,529,749 | B2 | 12/2016 | Hollis | |
| 9,621,303 | B2 | 4/2017 | Bourstein | |
| 2016/0062692 | A1 * | 3/2016 | Finkbeiner | G11C 7/06 711/154 |
| 2020/0380384 | A1 * | 12/2020 | Karunaratne | G06N 20/10 |

* cited by examiner

*Primary Examiner* — Hashem Farrokh
(74) *Attorney, Agent, or Firm* — Morgan, Lewis & Bockius, LLP

(57) ABSTRACT

An inversion encoder is configured to receive a plurality of bytes of data for parallel output to a data bus; determine, in parallel, Hamming distances of neighboring pairs of bytes of the received plurality of bytes of data; for each neighboring pair of bytes of the received plurality of bytes, determine, in parallel, for each of the neighboring pairs of bytes, whether a respective Hamming distance satisfies a majority function; if a respective Hamming distance for a particular pair of bytes of the neighboring pairs of bytes satisfies the majority function: set an inversion bit for a second byte of the particular pair of bytes to be the opposite of an inversion bit for a first byte of the particular pair of bytes; invert, or forgo inverting, the second byte based on the inversion bit for the second byte; and provide the second byte for output to the data bus.

20 Claims, 11 Drawing Sheets

AC Inversion Encoding Circuit 600

AC Inversion Encoding Circuit 700

FAST BUS INVERSION FOR NON-VOLATILE MEMORY

TECHNICAL FIELD

The present disclosure relates to data storage systems, and in particular, to an encoding scheme at an interface between a storage controller and a storage medium of a data storage system.

BACKGROUND

Non-volatile memories, such as flash memory devices, have supported the increased portability of consumer electronics, and have been utilized in relatively low power enterprise storage systems suitable for cloud computing and mass storage. The ever-present demand for almost continual advancement in these areas is often accompanied by demand to improve data storage capacity. The demand for greater storage capacity in turn stokes demand for greater performance (e.g., quicker reads and writes), so that the addition of storage capacity does not slow down the memory device. As such, there is ongoing pressure to increase the capacity and the operating speed of non-volatile memories in order to further improve the useful attributes of such devices.

SUMMARY

This application describes various systems and methods of encoding data at an interface between a storage controller and a storage medium. Various implementations of systems and methods within the scope of the appended claims each have several aspects, no single one of which is solely responsible for the desirable attributes described herein. Without limiting the scope of the appended claims, some prominent features are described. After considering this discussion, and particularly after reading the section entitled "Detailed Description" one will understand how the features of various implementations are used to improve performance at the interface in a tunable and scalable manner.

BRIEF DESCRIPTION OF THE DRAWINGS

So that the present disclosure can be understood in greater detail, a more particular description may be had by reference to the features of various implementations, some of which are illustrated in the appended drawings. The appended drawings, however, merely illustrate the more pertinent features of the present disclosure and are therefore not to be considered limiting, for the description may admit to other effective features.

Figure 1:
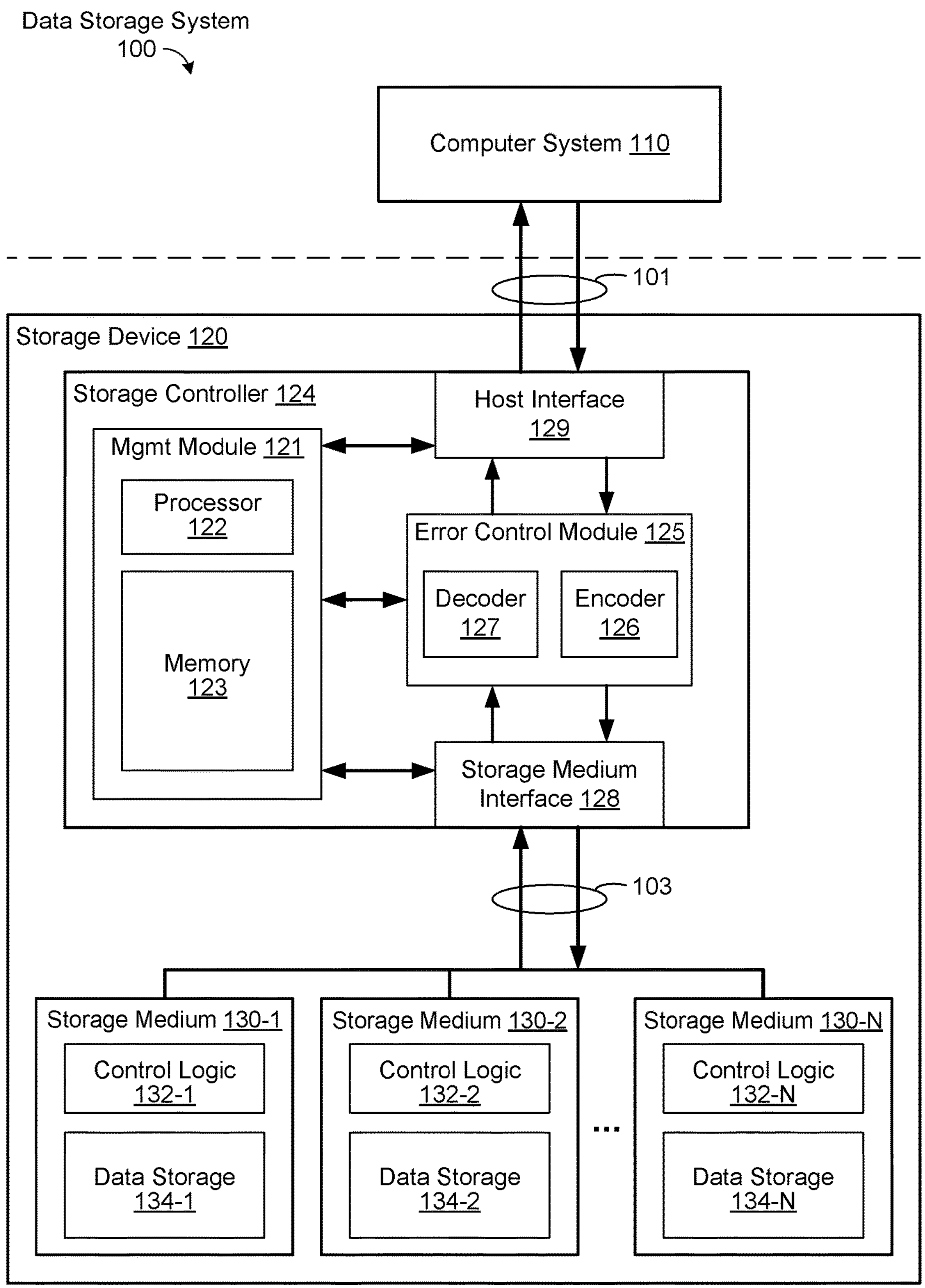
FIG. 1 is a block diagram of a data storage system in accordance with some implementations.

In accordance with common practice the various features illustrated in the drawings may not be drawn to scale. Accordingly, the dimensions of the various features may be arbitrarily expanded or reduced for clarity. In addition, some of the drawings may not depict all of the components of a given system, method or device. Finally, like reference numerals are used to denote like features throughout the specification and figures.

DETAILED DESCRIPTION

FIG. 1 is a diagram of an implementation of a data storage environment, namely data storage system 100. While certain specific features are illustrated, those skilled in the art will appreciate from the present disclosure that various other features have not been illustrated for the sake of brevity, and so as not to obscure more pertinent aspects of the example implementations disclosed herein. To that end, as a non-limiting example, the data storage system 100 includes a data processing system (alternatively referred to herein as a computer system or host) 110, and a storage device 120.

The computer system 110 is coupled to the storage device 120 through data connections 101. In various implementations, the computer system 110 includes the storage device 120 as a component. Generally, the computer system 110 includes any suitable computer device, such as a computer, a laptop computer, a tablet device, a netbook, an internet kiosk, a personal digital assistant, a mobile phone, a smart phone, a gaming device, a computer server, a peripheral component interconnect (PCI), a serial AT attachment (SATA), or any other computing device. In some implementations, the computer system 110 includes one or more processors, one or more types of memory, a display, and/or other user interface components such as a keyboard, a touch screen display, a mouse, a trackpad, a digital camera, and/or any number of supplemental devices to add functionality.

The storage device 120 includes one or more storage mediums 130 (e.g., N storage mediums 130, where N is an integer greater than or equal to 1). The storage medium(s) 130 are coupled to a storage controller 124 through data connections 103. In various implementations, the storage controller 124 and storage medium(s) 130 are included in the same device (e.g., storage device 120) as constituent components thereof, while in other embodiments, the storage controller 124 and storage medium(s) 130 are, or are in, separate devices. In some embodiments, the storage controller 124 is an application-specific integrated circuit (ASIC). The storage medium(s) 130 are optionally referred to as the NAND.

Each storage medium 130 includes control logic 132 and data storage 134. The data storage 134 may comprise any number (i.e., one or more) of memory devices including, without limitation, non-volatile semiconductor memory devices, such as flash memory. Flash memory devices can be configured for enterprise storage suitable for applications such as cloud computing, and/or configured for relatively smaller-scale applications such as personal flash drives or hard-disk replacements for personal, laptop and tablet computers.

In some implementations, the storage controller 124 includes a management module 121, an error control module 125, a storage medium interface 128, and a host interface 129. In some implementations, the storage controller 124 includes various additional features that have not been illustrated for the sake of brevity, and so as not to obscure more pertinent features of the example implementations disclosed herein. As such, a different arrangement of features may be possible.

The host interface 129 couples the storage device 120 and its storage controller 124 to one or more computer systems 110. The host interface 129 typically includes data buffers (not shown) to buffer data being received and transmitted by the storage device 120 via the data connections 101.

The storage medium interface 128 couples the storage controller 124 to the storage medium(s) 130. The storage medium interface 128 provides an interface to the storage medium(s) 130 though the data connections 103. In some implementations, the storage medium interface 128 includes read and write circuitry.

The error control module 125 is coupled between the storage medium interface 128 and the host interface 129. In some implementations, the error control module 125 is provided to limit the number of uncorrectable errors inadvertently introduced into data. To that end, the error control module 125 includes an encoder 126 and a decoder 127. The encoder 126 encodes data to produce a codeword which is subsequently stored in a storage medium 130. When the encoded data is read from the storage medium 130, the decoder 127 applies a decoding process to recover the data and correct errors within the error correcting capability of the error control code. Various error control codes have different error detection and correction capacities, and particular codes are selected for various applications.

The management module 121 typically includes one or more processors 122 (sometimes referred to herein as CPUs, processing units, hardware processors, processors, microprocessors or microcontrollers) for executing modules, programs and/or instructions stored in memory and thereby performing processing operations. However, in some implementations, the processor(s) 122 are shared by one or more components within, and in some cases, beyond the function of the storage controller 124. The management module 121 is coupled by communication buses to the host interface 129, the error control module 125, and the storage medium interface 128 in order to coordinate the operation of these components.

The management module 121 also includes memory 123 (sometimes referred to herein as controller memory), and one or more communication buses for interconnecting the memory 123 with the processor(s) 122. Communication buses optionally include circuitry (sometimes called a chipset) that interconnects and controls communications between system components. The controller memory 123 includes high-speed random access memory, such as DRAM, SRAM, DDR RAM or other random access solid state memory devices, and may include non-volatile memory, such as one or more magnetic disk storage devices, optical disk storage devices, flash memory devices, or other non-volatile solid state storage devices. The controller memory 123 optionally includes one or more storage devices remotely located from the one or more processors 122. In some embodiments, the controller memory 123, or alternatively the non-volatile memory device(s) within the controller memory 123, comprises a non-transitory computer readable storage medium. In some embodiments, the controller memory 123, or the non-transitory computer readable storage medium of the controller memory 123, stores the programs, modules, and/or data structures, or a subset or superset thereof, for performing one or more of the operations described in this application with regard to any of the components associated with the storage controller 124.

In some embodiments, the various operations described in this application correspond to sets of instructions for performing the corresponding functions. These sets of instructions (i.e., modules or programs) need not be implemented as separate software programs, procedures or modules, and thus various subsets of these modules may be combined or otherwise re-arranged in various embodiments. In some embodiments, the memory 123 may store a subset of modules and data structures. Furthermore, the memory 123 may store additional modules and data structures. In some embodiments, the programs, modules, and data structures stored in the memory 123, or the non-transitory computer readable storage medium of the memory 123, provide instructions for implementing any of the methods described below. Stated another way, the programs or modules stored in the memory 123, when executed by the one or more processors 122, cause the storage device 120 to perform any of the operations described below. Although FIG. 1 shows various modules, FIG. 1 is intended more as functional description of the various features which may be present in the modules than as a structural schematic of the embodiments described herein. In practice, the programs, modules, and data structures shown separately could be combined, and some programs, modules, and data structures could be separated.

Figure 2:
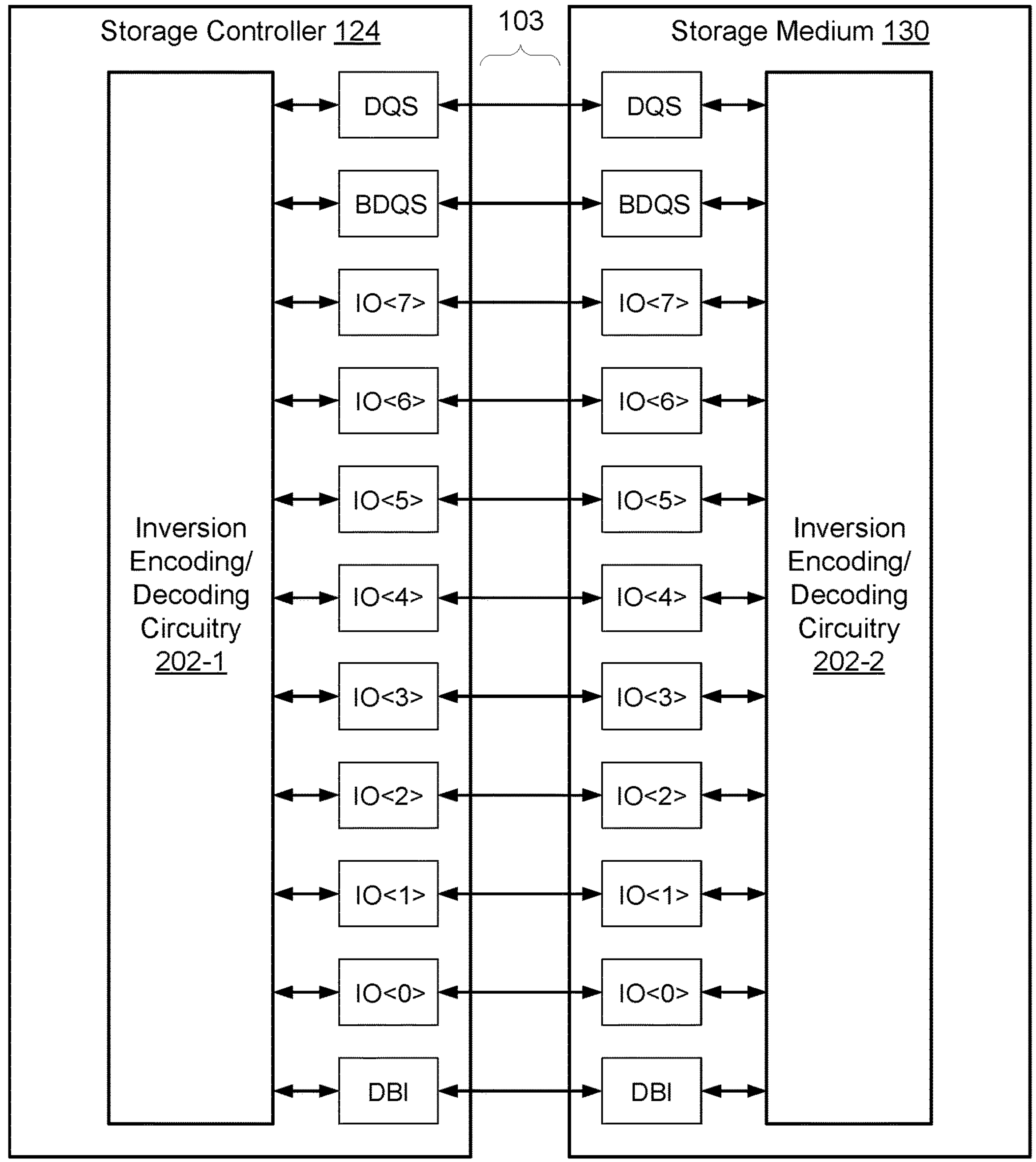
FIG. 2 is a block diagram of an electrical interface and data bus in accordance with some implementations.

FIG. 2 is a detailed diagram of an electrical interface 200 connected the storage controller 124 and the storage medium 130 in accordance with some implementations. The interface 200 includes data connections 103, which connect data and control signal pads of the storage medium interface 128 of the storage controller 124 with corresponding data and control signal pads of the controller interface 202 of the storage medium 130. The data connections 103 may be referred to as a bus, and they include a plurality of data bits (e.g., an 8-bit data bus including IO<0> through IO<7> data bits), a data bus inversion (DBI) bit, data strobe (DQS and BDQS) signals, and various other control signals (not shown).

Each side of the interface 200 (the storage controller 124 side and the storage medium 130 side) includes inversion encoding/decoding circuitry 202 (also referred to as an inversion encoder and decoder). The inversion encoding/decoding circuitry 202 is configured to encode data bits (e.g., IO<7:0>) for output to the bus in accordance with an inversion encoding scheme, and decode data bits received from the bus in accordance with an inversion decoding scheme. For example, inversion encoding circuitry 202-1 of the storage controller 124 may encode data for transmission via the bus to storage medium 130 in accordance with an inversion encoding scheme, and inversion decoding circuitry 202-2 of the storage medium 130 may decode the data (received via the bus) in accordance with an inversion decoding scheme.

Inversion encoding is an encoding technique used for encoding bus transmissions for low power systems. Since a large amount of current is consumed due to bit transitions (1→0 and 0→1) and simultaneous data transfers (e.g., multiple is being transmitted at the same time), reducing these transitions and data transfers optimizes power dissipation by reducing the average current, and reduces noise by reducing peak currents caused by simultaneous data transfers. This is done by introducing an additional signal line, referred to as a data bus inversion (DBI) line, to the bus lines. This signal determines whether the other lines should be inverted or not. Stated another way, depending on the value of the DBI line, the other data lines will be used with or without inversion. For example, if the DBI line is 0, the data on the bus is sampled as it is, but if the DBI line is 1, the data on the bus is inverted before any processing on it (e.g., before outputting to the data connections 103). As a specific example, if the IO bits are <01101001> and DBI is 1 (invert), the bits that will actually be transmitted on the bus are <10010110>. On the other hand, if DBI is 0 (do not invert), then the bits that will actually be transmitted on the bus are <01101001>.

Figure 3:
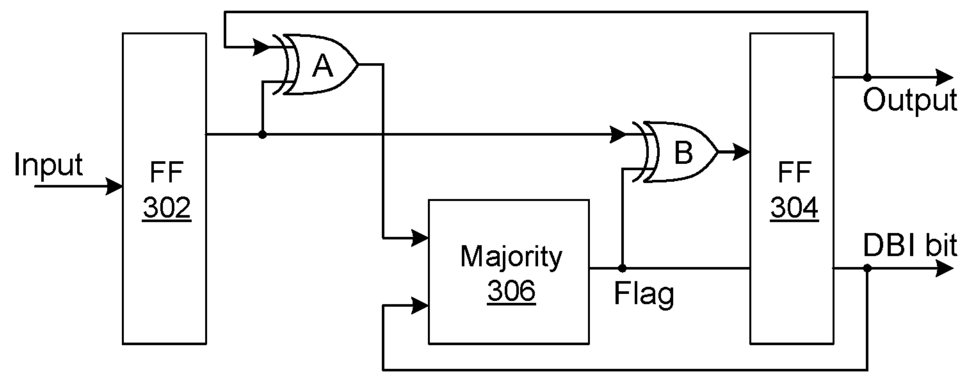
FIG. 3 is an AC inversion encoding circuit in accordance with some implementations.

FIG. 3 is an AC inversion encoding circuit 300 in accordance with some implementations. The AC inversion encoding circuit 300 limits the number of bit transitions between consecutive bytes to 4. For example, the circuit 300 receives the following consecutive bytes:

<01101001> (first byte)

<01001110> (second byte)

The number of transitions (underlined) between the consecutive bytes is 4. In this case, the circuit 300 passes the second byte without inverting it.

In another example, the circuit 300 receives the following consecutive bytes:

<01101001> (first byte)

<11001110> (second byte)

The number of transitions (underlined) between the consecutive bytes is 5. In this case, the circuit 300 inverts the second byte before passing it.

As a result of the inversion, the consecutive bytes that are passed to the data bus are:

<01101001> (first byte)

<00110001> (inverted second byte)

The number of transitions (underlined) has been reduced from 5 to 3, thereby reducing power and noise.

Referring to FIG. 3, each consecutive byte is received at flip flop 302, which passes the data to the rest of the circuit. Corresponding bits for consecutively received bytes are compared at XOR gate A. In other words, gate A compares the first bits of a first and second byte, then compares the second bits of a first and second byte, and so forth. If corresponding bits are different (due to a 140 or 041 transition), gate A outputs a 1; otherwise, gate A outputs a 0.

Majority circuitry 306 tracks the number of transitions detected at gate A (the number of is outputted by the gate), and applies a majority function (also referred to as a majority vote). If the majority function has n inputs, the majority function outputs a 1 if more than n/2 inputs are true. In other words, the majority function outputs a 1 when more than half of its inputs are 1, and outputs a 0 otherwise. In the case of consecutive 8-bit bytes, the majority circuitry 306 outputs a 1 if the number of bit transitions in consecutive bytes is greater than 4.

Each byte is inverted or not inverted at XOR gate B based on the value of the output (flag) of the majority circuitry 306. If the majority circuitry 306 outputs a 1 (due to 5 or more transitions being detected between a present byte and a previous byte), then gate B inverts the present byte. If the majority circuitry 306 does not output a 1 (due to less than 5 transitions being detected), then gate B does not invert the present byte. The majority circuitry 306 provides the output flag (referred to as a DBI bit or an inversion bit) for output at flip flop 304. The present byte (either inverted or not inverted) is provided at flip fop 304, and the circuit 300 outputs the present byte along with the corresponding DBI bit.

When the present byte and corresponding DBI bit are received at a decoding circuit on the other side of the data bus, the decoding circuit XORs the byte with the DBI bit in order to decode the byte. In other words, if the DBI bit is 0, an XOR gate at the decoder passes the byte for additional processing without inverting it. If the DBI bit is 1, however, this indicates that the byte was inverted at the encoder. As such, the XOR gate inverts the byte again, thereby providing the original byte for additional processing.

Figure 4:
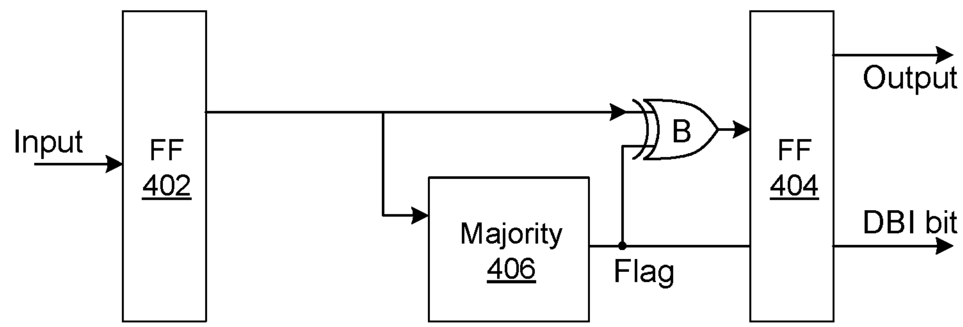
FIG. 4 is a DC inversion encoding circuit in accordance with some implementations.

FIG. 4 is a DC inversion encoding circuit 400 in accordance with some implementations. The DC inversion encoding circuit 400 limits the number of bits that are equal to a predetermined value (0 or 1) to 4 or less, by inverting bytes that have more than 4 of the predetermined value. For example, the circuit 400 is configured to limit the number of 1s in a byte, and the circuit 400 receives the following byte: <01101101>, which has five 1s. As such, the circuit 400 inverts the byte to <10010010>, which has 3 1s, and passes the inverted byte for output at the bus.

Specifically, the circuit 400 receives a byte at flip flop 402 and passes its bits to majority circuitry 406. Majority circuitry 406 works the same way as majority circuitry 306, in that it implements a majority function that outputs (flag) a 1 if five or more of its inputs are 1.

Each byte is inverted or not inverted at XOR gate B based on the value of the output (flag) of the majority circuitry 406. If the majority circuitry 406 outputs a 1 (due to 5 or more bits having a predetermined value being detected), then gate B inverts the present byte. If the majority circuitry 406 does not output a 1 (due to less than 5 bits having the predetermined value being detected), then gate B does not invert the present byte. The majority circuitry 406 provides the output flag (referred to as a DBI bit or an inversion bit) for output at flip flop 404. The present byte (either inverted or not inverted) is provided at flip fop 404, and the circuit 400 outputs the present byte along with the corresponding DBI bit.

When the present byte and corresponding DBI bit are received at a decoding circuit on the other side of the data bus, the decoding circuit XORs the byte with the DBI bit in order to decode the byte. In other words, if the DBI bit is 0, an XOR gate at the decoder passes the byte for additional processing without inverting it. If the DBI bit is 1, however, this indicates that the byte was inverted at the encoder. As such, the XOR gate inverts the byte again, thereby providing the original byte for additional processing.

Figure 5:
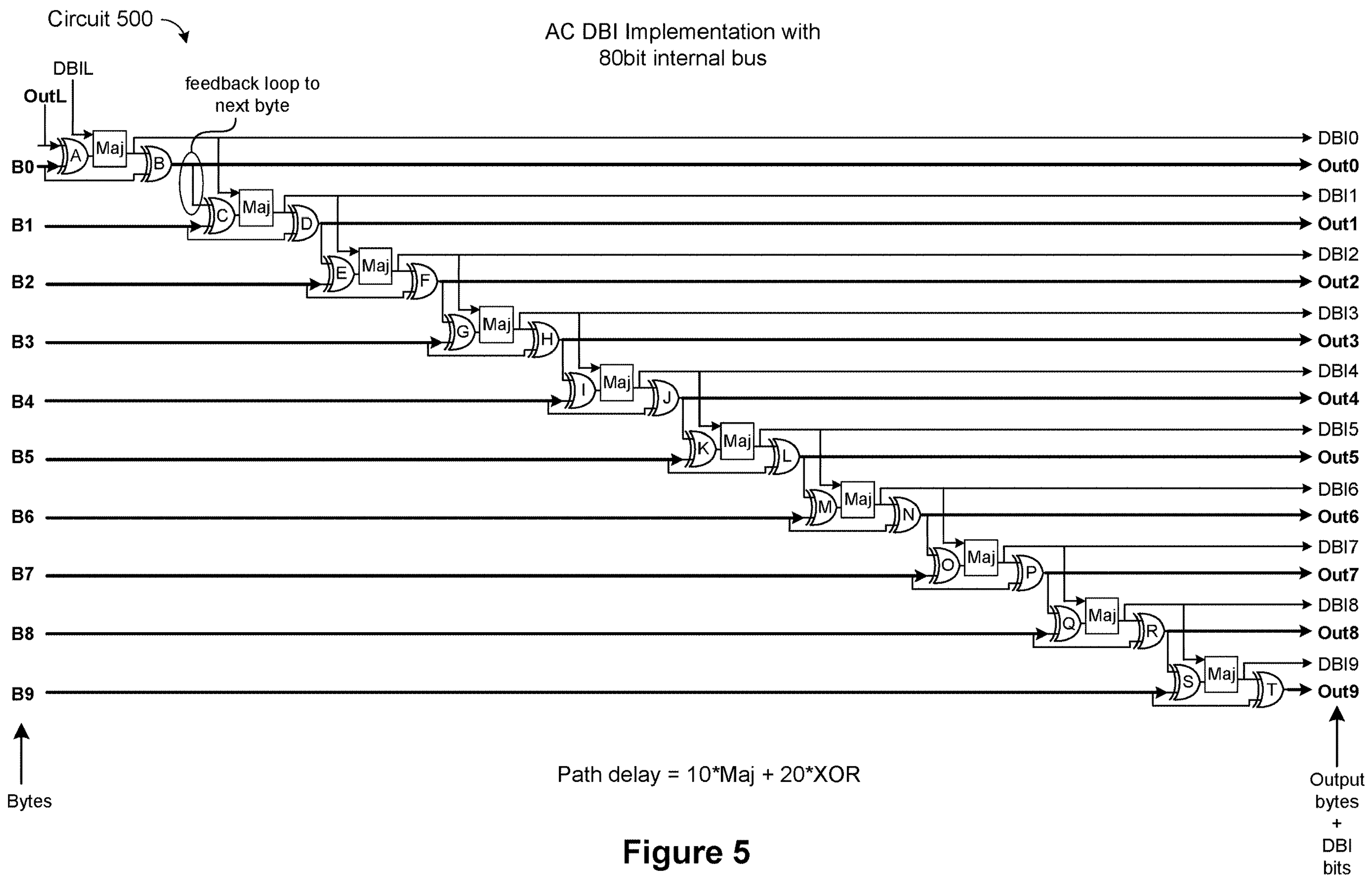
FIG. 5 is an inversion encoding circuit for a wide bus in accordance with some implementations.

FIG. 5 is an AC inversion encoding circuit 500 in accordance with some implementations. The principle of operation of circuit 500 is the same as that of circuit 300 (FIG. 3), with the only difference being the addition of additional bytes. The bus in circuit 500 is increased to an 80-bit bus (10 bytes, B0 through B9). As such, multiple logic stages must be completed before the encoded bytes and their corresponding DBI bits can be ready for outputting.

For each byte B0-B9, two XOR comparisons are required:

A first comparison of the current byte Bn with the previous byte Bn−1. For the first byte B0, the previous byte is denoted BL, the last byte to be processed from the previous bit bus.

A second comparison involving the previous DBI bit (the DBI bit corresponding with the output of the previously processed byte. For the first byte B0, the previous DBI bit is denoted DBIL, corresponding to the last byte to be processed from the previous bit bus.

The first comparison involves XOR gates A, C, E, G, I, K, M, O, Q, and S, and the second comparison involves the majority circuits ("Maj") and gates B, D, F, H, J, L, N, P, R, and T. Each gate requires feedback data from a process involving a previous byte. For example, byte comparison gate C for byte B1 requires the output of DBI comparison gate B from byte B0, and DBI comparison gate D for byte B1 requires the output of the majority circuit for byte B0. As such, gates A through T must be operated in series. There are 10 majority circuits, each with its own delay (Maj), and 20 gates, each with its own delay (XOR). Thus, from bytes B0-B9 to output bytes Out0-Out9 and inversion bits DBI0-DBI9, the total path delay of circuit 500 is equal to 10*Maj+20*XOR.

Figure 6:
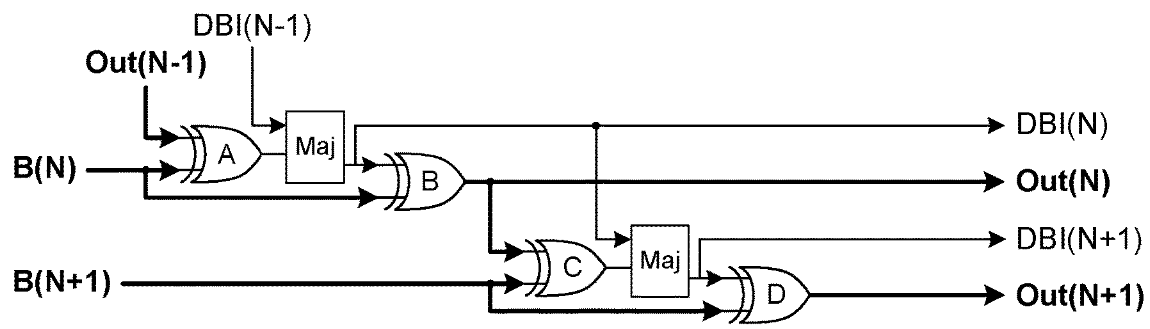
FIG. 6 is an inversion encoding circuit in accordance with some implementations.

FIG. 6 is an AC inversion encoding circuit 600 in accordance with some implementations. Circuit 600 is a generalized version of circuit 500, encoding N+1 bytes and providing N+1 output bytes and corresponding inversion bits. Circuit 600 is provided as a reference in comparison to circuit 700 discussed below.

As data storage systems continue to improve, bus transfer speeds grow and the data bus itself widens (e.g., 64-bit, 80-bit, or higher). Since the AC inversion encoding circuits 300, 500, and 600 (FIGS. 3, 5, and 6) require feedback of the previous byte's data at every logical stage, the total path delay may be too long to keep up with improvements in bus transfer speeds and bus size. As a result, the inversion encoding implementations in FIGS. 3, 5, and 6 may not be supported as bus transfer speed requirements continue to increase. To address these issues, several enhancements may be made to the inversion encoding implementations described above.

Figure 7:
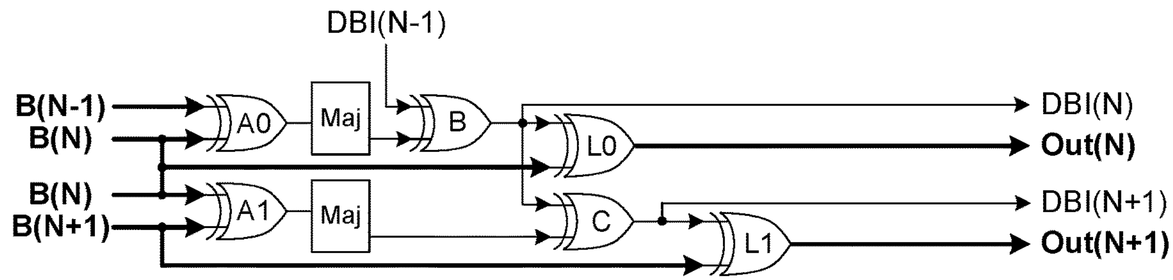
FIG. 7 is an inversion encoding circuit with parallel processing in accordance with some implementations.

FIG. 7 is an AC inversion encoding circuit 700 in accordance with some implementations. Consecutive pairs of bytes (e.g., B(N) and B(N+1)) are compared, in parallel, at a first set of XOR gates A0, A1, and so forth. For each comparison of a pair of bytes, corresponding bits are compared to detect transitions as described above with regard to transition detection gates A, C, etc. The transitions for each pair are counted in majority circuitry (Maj) as described above with reference to majority circuitry 306 (FIG. 3).

The number of detected bit transitions between corresponding bits of two bytes, as determined by the majority circuitry, is sometimes referred to as the Hamming distance between the two bytes. Stated another way, if corresponding bits of two bytes (e.g., B(N) and B(N+1)) are input into a transition detection XOR gate (e.g., A1), then the number of 1s output by the XOR gate is the Hamming distance.

For example, the circuit 700 receives the following consecutive bytes:

<01101001> (first byte)

<01001110> (second byte)

The number of transitions (underlined) between the consecutive bytes is 4. As such, the Hamming distance between the first byte and the second byte is 4.

When the Hamming distance between each consecutive pair of bytes is 5 or greater, respective majority circuitry outputs a 1. For any given byte, the output of the majority circuitry is compared, in a DBI determination XOR gate (e.g., B, C, etc.), with the DBI bit for the previous byte. The result of this comparison is the DBI bit for the current byte, and the DBI for the current byte is compared in a DBI comparison XOR gate (e.g., L0, L1, etc.) in order to invert or not invert the output byte (e.g., Out(N+1)).

Importantly, the transition detection XOR gates (A0, A1, etc.) detect transitions in parallel for consecutive pairs of bytes, since these gates do not require feedback from previous processing steps. In addition, the DBI determination XOR gate (B, C, etc.) for a current byte can determine a DBI value in parallel with the output process being handled by the DBI comparison XOR gate (L0, L1, etc.) of the previous byte. Both types of parallel processing (transition detections and DBI/output processing) provide optimizations that are necessary for adapting to increases in data bus speed requirements and data bus size.

Figure 8:
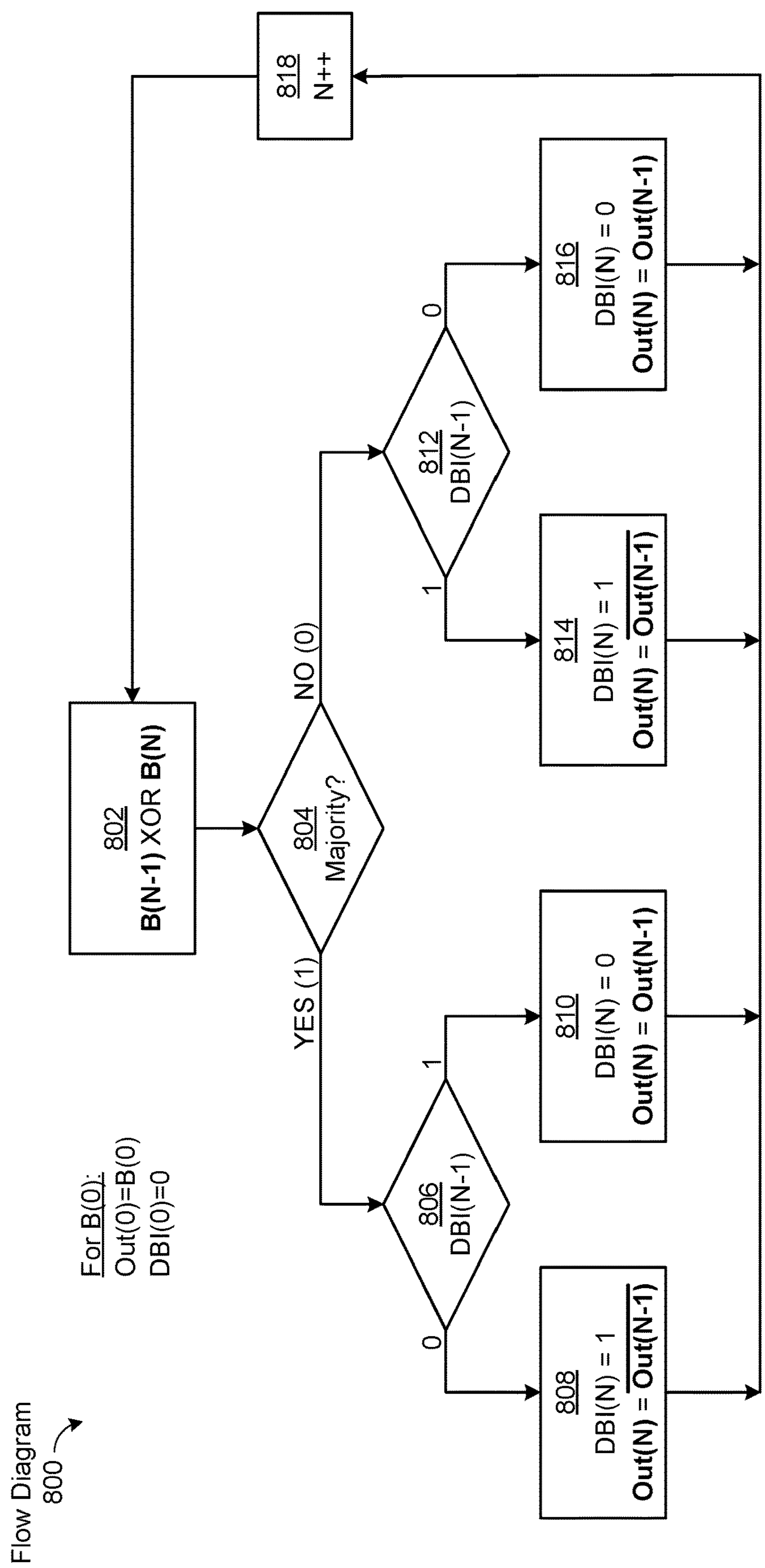
FIG. 8 is a flow diagram depicting operation of the inversion encoding circuit of FIG. 7 in accordance with some implementations.

FIG. 8 is a flow diagram 800 depicting operation of the inversion encoding circuit of FIG. 7 in accordance with some implementations. The inversion encoder receives a plurality of bytes of data for parallel output to the data bus. For the first byte B(0), the inversion encoder outputs Out(0) the byte without inverting it, and sets the DBI(0) for that byte to 0.

For each byte B(N), the inversion encoder determines (operation 802), in parallel, Hamming distances of neighboring pairs of bytes of the received plurality of bytes of data. For example, the inversion encoder compares each byte B(N) with a previous byte B(N-1) using a transition detection XOR gate (e.g., gate A1, FIG. 7).

For each neighboring pair of bytes of the received plurality of bytes, the inversion encoder determines (operation 804), in parallel for each of the neighboring pairs of bytes, whether a respective Hamming distance satisfies a majority function. For example, the inversion encoder passes the output of the transition detection XOR gate (e.g., gate A1, FIG. 7) to majority circuitry configured to output a 1 if the number of detected bit transitions is 5 or greater (designated as a majority), and output a 0 if the number of detected bit transitions is 4 or less (designated as not a majority).

In accordance with a determination that a respective Hamming distance for a particular pair of bytes of the neighboring pairs of bytes satisfies the majority function (804-YES), the inversion encoder (e.g., gate B, FIG. 7) sets an inversion bit for a second byte of the pair (DBI(N)) of the particular pair of bytes to be the opposite of an inversion bit for a first byte of the pair (DBI(N-1)) of the particular pair of bytes (since one input of the XOR gate B is 1 due to the majority function's output of 1 in operation 804, the output of the XOR gate B will be the opposite of the other input, which is DBI(N-1)). Specifically, if the inversion bit for the first byte of the pair (DBI(N-1)) is 0 (806-0), the inversion encoder sets (808) the inversion bit for the second byte of the pair (DBI(N)) to 1. Conversely, if the inversion bit for the first byte of the pair (DBI(N-1)) is 1 (806-1), the inversion encoder sets (810) the inversion bit for the second byte of the pair (DBI(N)) to 0.

The inversion encoder (e.g., gate L0, FIG. 7) inverts, or does not invert, the second byte Out(N) based on the inversion bit for the second byte DBI(N). Specifically, if the inversion bit DBI(N) for the second byte is 1, the inversion encoder inverts (808) the second byte Out(N). Conversely, if the inversion bit for the second byte is 0, the inversion encoder does not invert (810) the second byte Out(N).

For each pair of consecutive bytes, the inversion decoder provides the inverted or non-inverted second byte for output to the data bus. When the inversion decoder has determined an inversion bit DBI(N) for a given byte, the inversion decoder advances (818) to the next byte, but since operations 802 and 804 were done in parallel at the beginning of the process, there is no further delay when advancing through these steps for subsequent bytes since the corresponding processing is already complete.

Returning to operation 804, in accordance with a determination that a respective Hamming distance for a particular pair of bytes of the neighboring pairs of bytes does not satisfy the majority function (804-NO), the inversion encoder (e.g., gate B, FIG. 7) sets an inversion bit for a second byte of the pair (DBI(N)) of the particular pair of bytes to be equal to an inversion bit for a first byte of the pair (DBI(N-1)) of the particular pair of bytes (since one input of the XOR gate B is 0 due to the majority function's output of 0 in operation 804, the output of the XOR gate B will be equal to the other input, which is DBI(N-1)). Specifically, if the inversion bit for the first byte of the pair (DBI(N-1)) is 1 (812-1), the inversion encoder sets (814) the inversion bit for the second byte of the pair (DBI(N)) to 1. Conversely, if the inversion bit for the first byte of the pair (DBI(N-1)) is 0 (812-0), the inversion encoder sets (816) the inversion bit for the second byte of the pair (DBI(N)) to 0.

The inversion encoder (e.g., gate L0, FIG. 7) inverts, or does not invert, the second byte Out(N) based on the inversion bit for the second byte DBI(N). Specifically, if the inversion bit DBI(N) for the second byte is 1, the inversion encoder inverts (814) the second byte Out(N). Conversely, if the inversion bit for the second byte is 0, the inversion encoder does not invert (816) the second byte Out(N).

Figure 9:
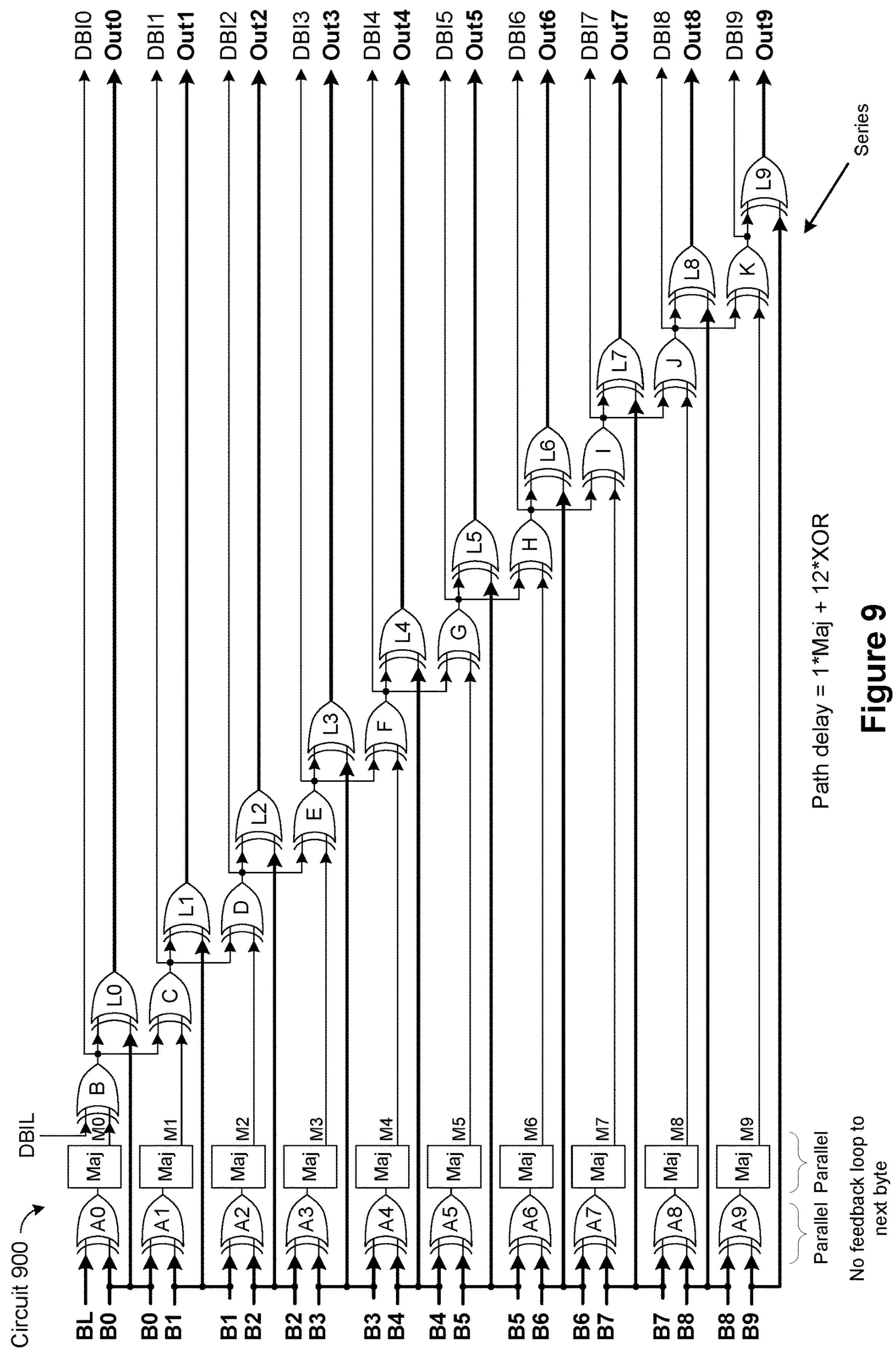
FIG. 9 is an inversion encoding circuit with parallel processing for a wide bus in accordance with some implementations.

For each pair of consecutive bytes, the inversion decoder provides the inverted or non-inverted second byte for output to the data bus. When the inversion decoder has determined an inversion bit DBI(N) for a given byte, the inversion decoder advances (818) to the next byte, but since operations 802 and 804 were done in parallel at the beginning of the process, there is no further delay when advancing through these steps for subsequent bytes since the corresponding processing is already complete FIG. 9 is an AC inversion encoding circuit 900 in accordance with some implementations. The principle of operation of circuit 900 is the same as that of circuit 700 (FIG. 7), with the only difference being the addition of additional bytes. The bus in circuit 900 is increased to an 80-bit bus (10 bytes, B0 through B9).

While the data bus in circuit 900 is the same size (80 bits) as that in circuit 500 (FIG. 5), the total path delay (from bytes B0-B9 to output bytes Out0-Out9 and inversion bits DBI0-DBI9) is significantly decreased due to the parallel processing of the transition detection XOR gates A0-A9 with respect to each pair of consecutive bytes, and the majority circuitry (outputting signals M0-M9) with respect to each pair of consecutive bytes.

The DBI determination XOR gates (B through K) still require feedback from previous processing, and therefore must still be operated in series. Each of the DBI comparison XOR gates (L0-L9), on the other hand, can operate in parallel with the DBI determination XOR gate for the next byte. In sum, the inversion encoding circuit 900 has one serial processing stage (DBI determination using XOR gates B-K), and three parallel processing stages: (i) transition detection (gates A0-A9), (ii) majority function (M0-M9), and (iii) final DBI comparison (gates L0-L9).

As a result of the parallel processing described above, the path delay in circuit 900 is influenced by 1 XOR gate delay for parallel gates A1-A9, 1 majority circuit delay for parallel majority circuits M1-M9, 10 XOR gate delays for serial gates B-K, and 1 XOR gate delay for the final output gate L9. Thus, the total path delay of circuit 900 is equal to 1*Maj+12*XOR. This results in a significant drop in delay compared to that of circuit 500 (FIG. 5), which was equal to 10*Maj+20*XOR.

In some implementations, the serial processing stage in inversion encoding circuit 900 (DBI determination XOR gates B through K) may be alternatively implemented as a combinational circuit in order to further decrease the total path delay.

Figures 10, 11:
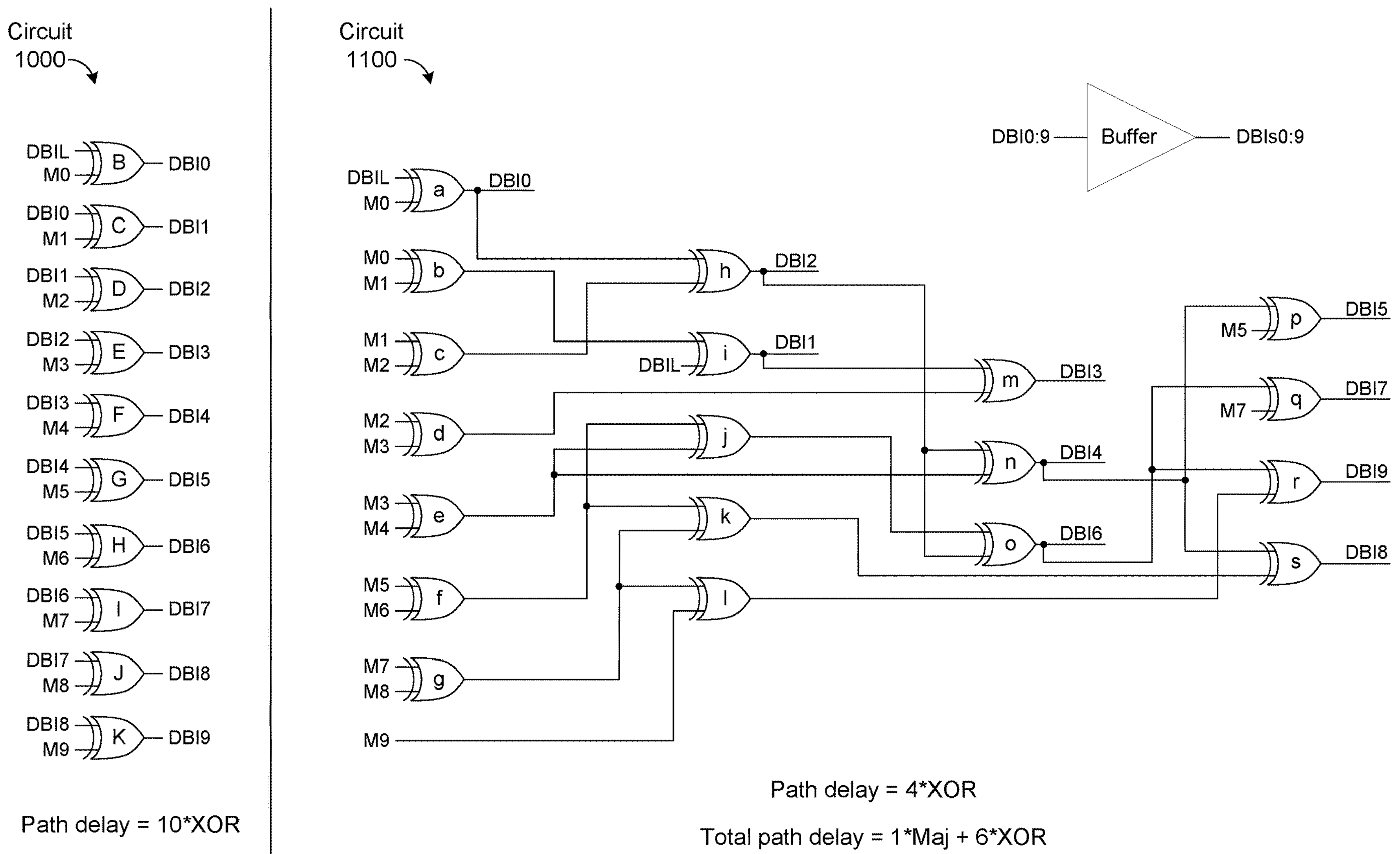
FIG. 10 is an inversion bit generation circuit in accordance with some implementations.
FIG. 11 is an inversion bit generation circuit with parallel processing in accordance with some implementations.

FIG. 10 is the serial DBI determination processing stage, also referred to as an inversion bit generation circuit 1000, of circuit 900, displayed in isolation to highlight the serial dependencies and path delay. Each of DBI determination XOR gates B through K depend on the output of the gate before it. As such, since there are 10 XOR gates in series, the path delay of this serial circuit is equal to 10*XOR.

FIG. 11 is a combinational inversion bit generation circuit 1100 in accordance with some implementations. Circuit 1100 may replace circuit 1000 (the serial DBI determination processing stage (XOR gates B through K) of circuit 900 (FIG. 9)). While circuit 1100 comprises more XOR gates compared to circuit 1000, the XOR gates in circuit 1100 are arranged as a combinational circuit with only four sub-stages instead of the 10 sub-stages in circuit 1000. As such, the path delay is only 4*XOR (resulting in a decrease of 6*XOR). When the combination circuit 1100 is implemented as part of circuit 900 (FIG. 9) in place of the serial circuit 1000, the total path delay drops to 1*Maj+6*XOR (compared to the delay of 1*Maj+12*XOR with the serial circuit 1000).

In general, when circuit 900 receives P bytes of data, the inversion encoder, implementing circuit 1100 instead of circuit 1000, may determine inversion bits for each byte using combinational circuitry comprising N logical stages, where N is less than P. Depending on the configuration of the circuit 1000, N may even be less than P/2. In some implementations, each of the N logical stages comprises one or more XOR gates. In the example configurations shown in FIGS. 9 and 11, circuit 900 receives P=10 bytes, and circuit 1100 generates inversion bits for each of the 10 bytes using only N=4 logical stages. The first stage includes 7 XOR gates, the second stage includes 5 XOR gates, the third stage includes 3 XOR gates, and the fourth stage includes 4 XOR gates. As a result of the combinational nature of circuit 1100, some inversion bits may be determined in even less time. For instance, DBI0 may be determined in one stage, DBI1 and DBI2 may be determined in two stages, DBI3, DBI4, and DBI6 may be determined in three stages, and DBI5, DBI7, DBI8, and DBI9 may be determined in four stages. In some implementations, circuit 1100 further includes a buffer configured to buffer the output bytes DBI0-DBI9 as they become available and release them in parallel (DBIs0-DBIs9).

Figure 12:
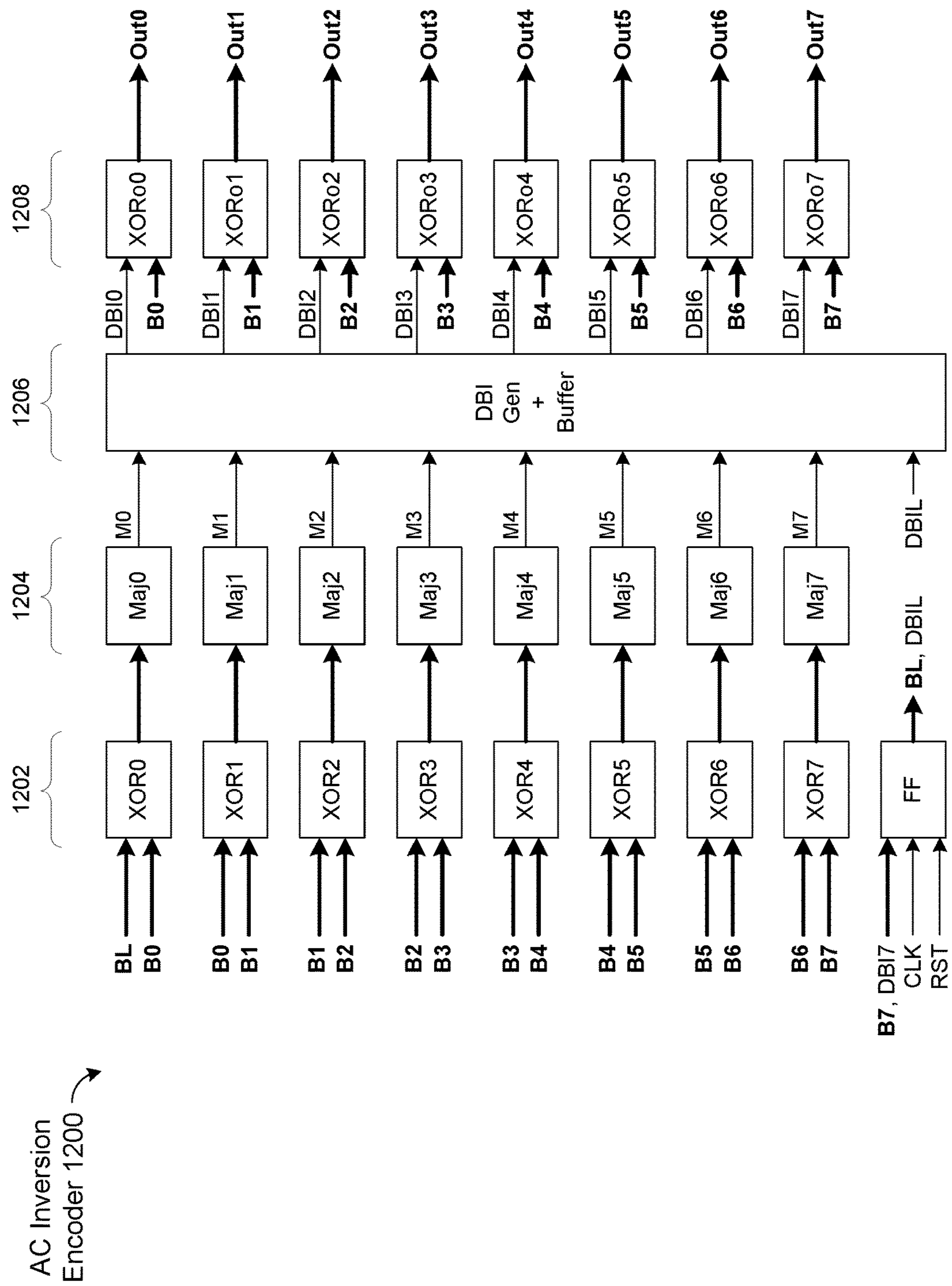
FIG. 12 is a block diagram of an AC inversion encoder with parallel processing for a wide bus in accordance with some implementations.

FIG. 12 is a block diagram of an AC inversion encoding circuit 1200 (also referred to as an inversion encoder) in accordance with some implementations. AC inversion encoding circuit 1200 corresponds with AC inversion encoding circuit 900.

Circuit 1200 includes a transition detection stage 1202 comprising a plurality of XOR gates (A0, A1, etc. in circuit 900). The transition detection stage may also be referred to as data receiving circuitry configured to receive a plurality of bytes of data for parallel output to the data bus. While circuit 1200 includes 8 bytes, other bus configurations (e.g., 10 bytes or more, or less than 8 bytes) may be possible while retaining the same principles as described herein. The transition detection phase corresponds to gates A0-A9 in circuit 900. Features shared with the operation of these gates are not further discussed for purposes of brevity. A latch flip flop (FF) is also included in order to store the late byte of data (BL) and inversion bit (DBL) processed from the previous data string.

Circuit 1200 further includes a majority function stage 1204 comprising a plurality of majority circuits (M1-M9 in circuit 900). Features shared with the operation of these circuits are not further discussed for purposes of brevity.

Circuit 1200 further includes an inversion bit generation stage 1206 comprising a plurality of XOR gates (B-K in circuit 1000, or a-s in circuit 1100). Features shared with the operation of these circuits are not further discussed for purposes of brevity.

Circuit 1200 further includes an output generation stage 1208 comprising a plurality of XOR gates XORo0-XORo9 (corresponding to gates L0-L9 in circuit 900. Features shared with the operation of these circuits are not further discussed for purposes of brevity.

Figure 13:
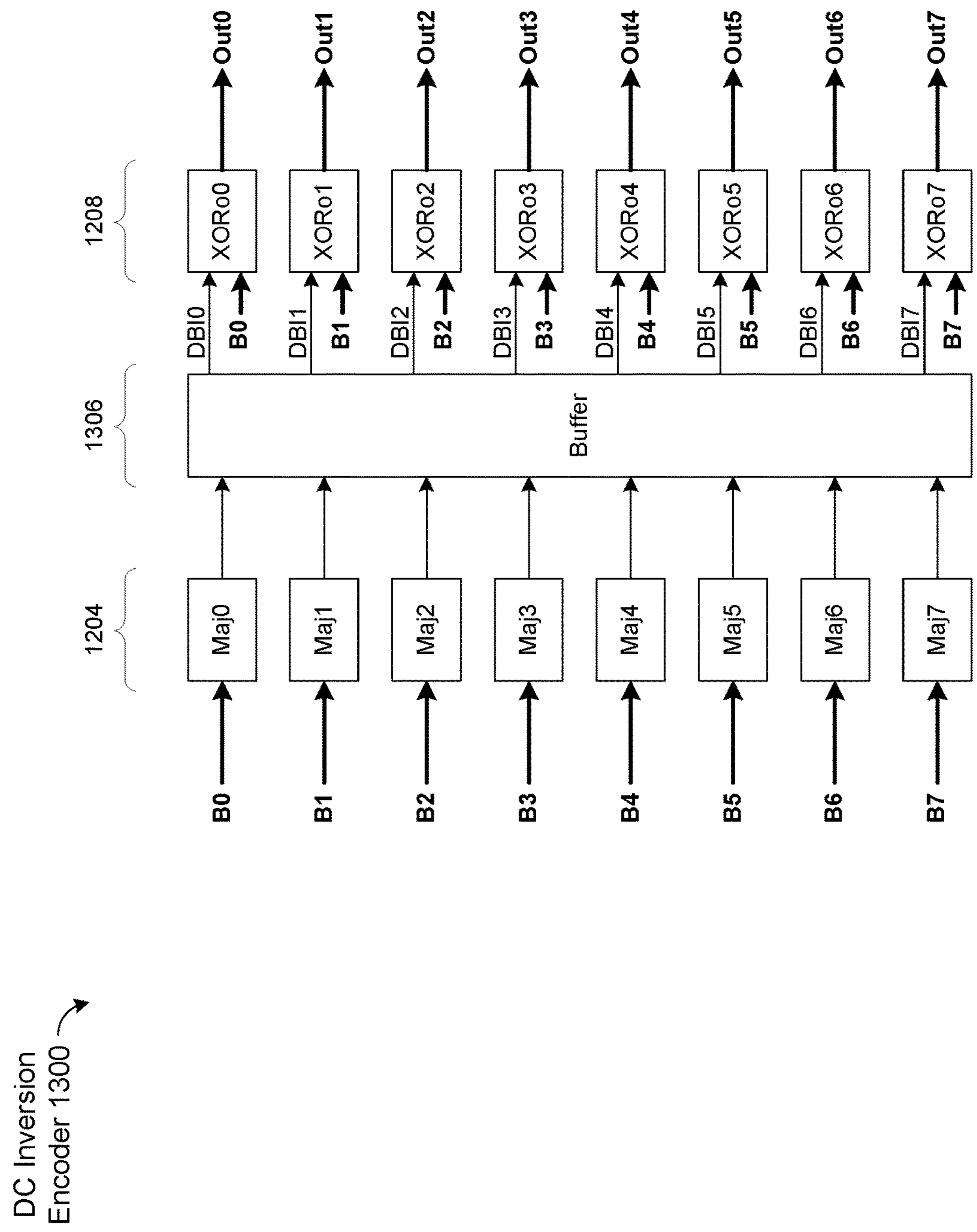
FIG. 13 is a block diagram of a DC inversion encoder with parallel processing for a wide bus in accordance with some implementations.

FIG. 13 is a block diagram of a DC inversion encoding circuit 1300 (also referred to as an inversion encoder) in accordance with some implementations. DC inversion encoding circuit 1300 corresponds to DC inversion encoding circuit 400.

Circuit 1300 includes an majority function stage 1204 comprising a plurality of majority circuits (406 in circuit 400; stage 1204 in circuit 1200). Features shared with the operation of these circuits are not further discussed for purposes of brevity Circuit 1300 further includes a buffer 1306 to drive the XOR gates in the output generation stage (described below). Features shared with the operation of these circuits are not further discussed for purposes of brevity.

Circuit 1300 further includes an output generation stage 1208 comprising a plurality of XOR gates XORo0-XORo9 (gate B in circuit 400; stage 1208 in circuit 1200). Features shared with the operation of these circuits are not further discussed for purposes of brevity.

The AC and DC inversion encoding circuits 1200 and 1300 share some common architecture (e.g., majority function stages 1204 and output generation stages 1208). As such, a hybrid AC+DC inversion encoding circuit (1400, described below) may be configured to leverage the similarities between each circuit. By adding multiplexing circuitry (described below), such a hybrid encoder can be made switchable to function as an AC inversion encoder or a DC inversion decoder, depending on the application.

Figure 14:
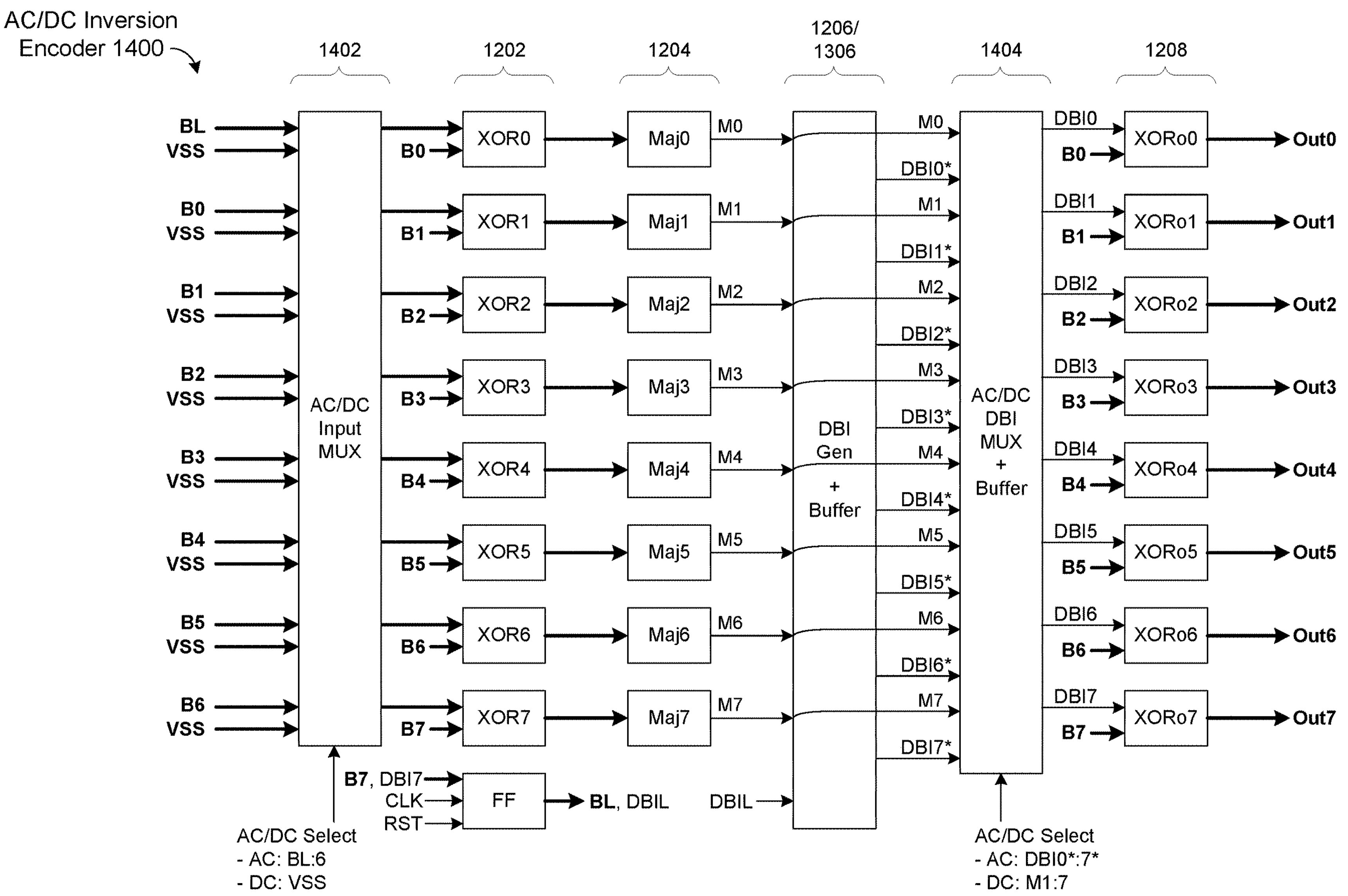
FIG. 14 is a block diagram of an AC and DC inversion encoder with parallel processing for a wide bus in accordance with some implementations.

FIG. 14 is a block diagram of an AC+DC inversion encoding circuit 1400 (also referred to as an inversion encoder) in accordance with some implementations. Circuit 1400 combines circuitry that is common to both AC inversion encoding circuit 1200 and DC inversion encoding circuit 1300, and adds multiplexing circuitry for switching between AC and DC schemes.

Circuit 1400 includes the transition detection stage 1202, the majority function stage 1204, the inversion bit generation stage 1206, and the output generation stage 1208 of circuit 1200. The buffer 1306 of circuit 1300 is also included, combined with the inversion bit generation stage 1206. Features shared with the operation of these circuits are not further discussed for purposes of brevity. Data receiving circuitry is configured to receive a plurality of bytes of data B0-B7 for parallel output to the data bus, as described above with reference to circuit 900 (FIG. 9).

Circuit 1400 includes a first multiplexer 1402 (referred to as an input multiplexer) controlled by an AC/DC selection setting. The AC/DC selection setting sets input multiplexer 1402 to operate in AC inversion encoding mode or DC inversion encoding mode.

When input multiplexer 1402 is set to AC inversion encoding mode, input multiplexer 1402 passes previous bytes BL-B6 to the transition detection stage 1202, which already has access to input bytes B0-B7. The transition detection stage 1202 signals bit pair transitions for consecutive neighboring bytes (e.g., between BL and B0, B0 and B1, B1 and B2, and so forth) of the plurality of bytes of data as described above with reference to circuit 900 (FIG. 9).

When input multiplexer 1402 is set to DC inversion encoding mode, input multiplexer 1402 passes a low voltage signal (VSS) to the transition detection stage 1202, thereby causing the input bytes B0-B7 to be automatically passed to the next stage (since the XOR gates making up stage 1202 each have an input that is 0 due to VSS, the XOR gates will output whatever the other input is). As such, stage 1202 passes the received plurality of bytes of data B0-B7 without signaling bit pair transitions.

Regarding the majority function stage 1204, when input multiplexer 1402 is set to AC inversion encoding mode, majority function stage 1204 is configured to determine whether a number of signaled bit pair transitions constitutes a majority of bit pairs for each of the successive neighboring bytes, as explained above with reference to the majority circuitry (M0-M9) of circuit 900. When input multiplexer 1402 is set to DC inversion encoding mode, majority function stage 1204 is configured to determine whether a number of bits equaling 1 or a number of bits equaling 0 constitutes a majority of bits for each of the received plurality of bytes, as described above with reference to majority circuitry 406 in circuit 400 (FIG. 4).

The inversion bit generation stage 1206 is configured to set a preliminary inversion bit (DBI0*-DBI7*) for each of the received plurality of bytes based on the majority function determinations, as described above with reference to majority circuits M0-M7 of circuit 900. This stage further integrates buffer 1306 for driving the XOR gates in the output generation stage 1208 as described above with reference to circuit 1300.

Circuit 1400 includes a second multiplexer 1404 (referred to as a DBI multiplexer) controlled by the same AC/DC selection setting that controls the input multiplexer 1402. The AC/DC selection setting sets the DBI multiplexer 1404 to operate in AC inversion encoding mode or DC inversion encoding mode.

When DBI multiplexer 1404 is set to AC inversion encoding mode, DBI multiplexer 1404 sets respective output inversion bits DBI0-DBI7 for each of the received plurality of bytes B0-B7 to respective preliminary inversion bits DBI0*-DBI7* for corresponding bytes B0-B7 of the received plurality of bytes.

When DBI multiplexer 1404 is set to DC inversion encoding mode, DBI multiplexer 1404 sets respective output inversion bits DBI0-DBI7 for each of the received plurality of bytes B0-B7 to respective outputs M0-M7 of the majority function stage 1204 for corresponding bytes B0-B7 of the received plurality of bytes.

In order to support both AC and DC inversion encoding data paths, the respective output M0-M7 of the majority function stage 1204 are passed to both (i) the inversion bit generation stage 1206 (for the AC data path), and (ii) the DBI multiplexer 1404 (for the DC data path) (bypassing the inversion bit generation stage 1206).

The output generation stage 1208 receives the plurality of bytes B0-B7 and their corresponding output inversion bits DBI0-DBI7, and passes respective output bytes Out0-Out7 of the received plurality of bytes to the output bus in accordance with the respective output inversion bits DBI0-DBI7 as set by the second multiplexer 1404 (as described above with reference to gates L0-L9 of circuit 900).

By implementing both AC and DC inversion encoding data paths in the same circuit 1400, the inversion encoding/decoding circuitry 202 (FIG. 2) can support both AC and DC inversion encoding in the same architecture, enabling one or the other depending on user and/or product requirements.

The foregoing description has been described with reference to specific implementations. However, the illustrative discussions above are not intended to be exhaustive or to limit the claims to the precise forms disclosed. Many variations are possible in view of the above teachings. The implementations were chosen and described to best explain principles of operation and practical applications, to thereby enable others skilled in the art.

The various drawings illustrate a number of elements in a particular order. However, elements that are not order dependent may be reordered and other elements may be combined or separated. While some reordering or other groupings are specifically mentioned, others will be obvious to those of ordinary skill in the art, so the ordering and groupings presented herein are not an exhaustive list of alternatives.

As used herein: the singular forms "a", "an," and "the" include the plural forms as well, unless the context clearly indicates otherwise; the term "and/or" encompasses all possible combinations of one or more of the associated listed items; the terms "first," "second," etc. are only used to distinguish one element from another and do not limit the elements themselves; the term "if" may be construed to mean "when," "upon," "in response to," or "in accordance with," depending on the context; and the terms "include," "including," "comprise," and "comprising" specify particular features or operations but do not preclude additional features or operations.

What is claimed is:

1. A data storage system, comprising:

a storage medium including a plurality of memory cells;

a storage controller in communication with the storage medium;

electrical interface circuitry configured to pass data on a data bus disposed between the storage medium and the storage controller; and an inversion encoder coupled to the electrical interface circuitry, the inversion encoder including circuitry configured to:

receive a plurality of bytes of data for parallel output to the data bus;

determine, in parallel, Hamming distances of neighboring pairs of bytes of the received plurality of bytes of data;

for each neighboring pair of bytes of the received plurality of bytes:

determine, in parallel, for each of the neighboring pairs of bytes, whether a respective Hamming distance satisfies a majority function;

in accordance with a determination that a respective Hamming distance for a particular pair of bytes of the neighboring pairs of bytes satisfies the majority function, set an inversion bit for a second byte of the particular pair of bytes to be the opposite of an inversion bit for a first byte of the particular pair of bytes; and in accordance with a determination that a respective Hamming distance for a particular pair of bytes of the neighboring pairs of bytes does not satisfy the majority function, set an inversion bit for a second byte of the particular pair of bytes to be equal to an inversion bit for a first byte of the particular pair of bytes;

invert, or forgo inverting, the second byte based on the inversion bit for the second byte; and provide the inverted or non-inverted second byte for output to the data bus.

2. The data storage system of claim 1, wherein the inversion encoder is configured to:

determine Hamming distances of neighboring pairs of the received bytes of data by determining, in parallel:

a first Hamming distance between a first of the received bytes of data and a second of the received bytes of data; and a second Hamming distance between the second of the received bytes of data and a third of the received bytes of data.

3. The data storage system of claim 2, wherein the inversion encoder is configured to:

determine the first Hamming distance by:

comparing respective bit pairs of the first of the received bytes of data and the second of the received bytes of data; and determining, based on the comparing, how many of the respective bit pairs have differing values; and determine that the first Hamming distance satisfies the majority function if at least a majority of the respective bit pairs have differing values.

4. The data storage system of claim 1, wherein:

the received plurality of bytes of data comprises P bytes of data, where P is at least eight; and the inversion encoder is configured to set inversion bits for each byte of the P bytes of data using combinational circuitry comprising N logical stages, where N is less than P.

5. The data storage system of claim 4, wherein:

N is less than or equal to P/2; and each of the N logical stages comprises one or more exclusive or (XOR) gates.

6. The data storage system of claim 4, wherein:

P is equal to 10;

N is equal to 4; and each of the N logical stages comprises between 3 and 7 exclusive or (XOR) gates.

7. A data storage system, comprising:

a storage medium including a plurality of memory cells;

a storage controller in communication with the storage medium;

electrical interface circuitry configured to pass data on a data bus disposed between the storage medium and the storage controller; and an inversion encoder coupled to the electrical interface circuitry, the inversion encoder including:

data receiving circuitry configured to receive a plurality of bytes of data for parallel output to the data bus;

a first multiplexer controlled by a first selection setting;

transition detection circuitry configured to, based on the first selection setting: (i) signal bit pair transitions for consecutive neighboring bytes of the plurality of bytes of data, or (ii) pass the received plurality of bytes of data without signaling bit pair transitions;

majority function circuitry configured to determine whether (i) a number of signaled bit pair transitions constitutes a majority of bit pairs for each of the consecutive neighboring bytes, or (ii) whether a number of bits equaling 1 or a number of bits equaling 0 constitutes a majority of bits for each of the received plurality of bytes;

inversion bit generation circuitry configured to set a preliminary inversion bit for each of the received plurality of bytes based on the majority function determinations;

a second multiplexer controlled by the first selection setting, wherein the second multiplexer is configured to, based on the first selection setting, set a respective output inversion bit for each of the received plurality of bytes to: (i) respective preliminary inversion bits for corresponding bytes of the received plurality of bytes, or (ii) respective outputs of the majority function circuitry for corresponding bytes of the received plurality of bytes; and output generation circuitry configured to pass respective bytes of the received plurality of bytes to the output bus in accordance with corresponding respective output inversion bits as set by the second multiplexer.

8. The data storage system of claim 7, wherein the first selection setting configures the inversion encoder to encode:

(i) alternating current (AC) inversion data signals; or (ii) direct current (DC) inversion data signals.

9. A method, of operating an inversion encoder of a data storage system, the method comprising:

receiving a plurality of bytes of data for parallel output to a data bus of the data storage system;

determining, in parallel, Hamming distances of neighboring pairs of bytes of the received plurality of bytes of data;

for each neighboring pair of bytes of the received plurality of bytes:

determining, in parallel, for each of the neighboring pairs of bytes, whether a respective Hamming distance satisfies a majority function;

in accordance with a determination that a respective Hamming distance for a particular pair of bytes of the neighboring pairs of bytes satisfies the majority function, setting an inversion bit for a second byte of the particular pair of bytes to be the opposite of an inversion bit for a first byte of the particular pair of bytes; and in accordance with a determination that a respective Hamming distance for a particular pair of bytes of the neighboring pairs of bytes does not satisfy the majority function, setting an inversion bit for a second byte of the particular pair of bytes to be equal to an inversion bit for a first byte of the particular pair of bytes;

inverting, or forgoing inverting, the second byte based on the inversion bit for the second byte; and providing the inverted or non-inverted second byte for output to the data bus.

10. The method of claim 9, wherein determining Hamming distances of neighboring pairs of the received bytes of data comprises determining, in parallel:

a first Hamming distance between a first of the received bytes of data and a second of the received bytes of data; and a second Hamming distance between the second of the received bytes of data and a third of the received bytes of data.

11. The method of claim 10, wherein:

determining the first Hamming distance comprises:

comparing respective bit pairs of the first of the received bytes of data and the second of the received bytes of data; and determining, based on the comparing, how many of the respective bit pairs have differing values; and determining that the first Hamming distance satisfies the majority function comprises determining that at least a majority of the respective bit pairs have differing values.

12. The method of claim 9, wherein:

the received plurality of bytes of data comprises P bytes of data, where P is at least eight; and the method further comprises setting inversion bits for each byte of the P bytes of data using combinational circuitry comprising N logical stages, where N is less than P.

13. The method of claim 12, wherein:

N is less than or equal to P/2; and each of the N logical stages comprises one or more exclusive or (XOR) gates.

14. The method of claim 12, wherein:

P is equal to 10;

N is equal to 4; and each of the N logical stages comprises between 3 and 7 exclusive or (XOR) gates.

15. A data storage system, comprising:

means for receiving a plurality of bytes of data for parallel output to a data bus of the data storage system;

means for determining, in parallel, Hamming distances of neighboring pairs of bytes of the received plurality of bytes of data;

for each neighboring pair of bytes of the received plurality of bytes:

means for determining, in parallel, for each of the neighboring pairs of bytes, whether a respective Hamming distance satisfies a majority function;

in accordance with a determination that a respective Hamming distance for a particular pair of bytes of the neighboring pairs of bytes satisfies the majority function, setting an inversion bit for a second byte of the particular pair of bytes to be the opposite of an inversion bit for a first byte of the particular pair of bytes; and in accordance with a determination that a respective Hamming distance for a particular pair of bytes of the neighboring pairs of bytes does not satisfy the majority function, setting an inversion bit for a second byte of the particular pair of bytes to be equal to an inversion bit for a first byte of the particular pair of bytes;

means for inverting, or forgoing inverting, the second byte based on the inversion bit for the second byte; and means for providing the inverted or non-inverted second byte for output to the data bus.

16. The data storage system of claim 15, wherein the means for determining Hamming distances of neighboring pairs of the received bytes of data comprise means for determining, in parallel:

a first Hamming distance between a first of the received bytes of data and a second of the received bytes of data; and a second Hamming distance between the second of the received bytes of data and a third of the received bytes of data.

17. The data storage system of claim 15, wherein:

the means for determining the first Hamming distance comprise:

means for comparing respective bit pairs of the first of the received bytes of data and the second of the received bytes of data; and means for determining, based on the comparing, how many of the respective bit pairs have differing values; and the means for determining that the first Hamming distance satisfies the majority function comprise means for determining that at least a majority of the respective bit pairs have differing values.

18. The data storage system of claim 15, wherein:

the received plurality of bytes of data comprises P bytes of data, where P is at least eight; and the data storage system further comprises means for setting inversion bits for each byte of the P bytes of data using combinational circuitry comprising N logical stages, where N is less than P.

19. The data storage system of claim 17, wherein:

N is less than or equal to P/2; and each of the N logical stages comprises one or more exclusive or (XOR) gates.

20. The data storage system of claim 17, wherein:

P is equal to 10;

N is equal to 4; and each of the N logical stages comprises between 3 and 7 exclusive or (XOR) gates.

* * * * *